United States Patent
Sandberg

(10) Patent No.: US 11,318,404 B2
(45) Date of Patent: May 3, 2022

(54) FRAMELESS EMC AIR FILTER

(71) Applicant: Permatron Corporation, Elk Grove Village, IL (US)

(72) Inventor: Leslye Sandberg, Elk Grove Village, IL (US)

(73) Assignee: Permatron Corporation, Elk Grove Village, IL (US)

( * ) Notice: Subject to any disclaimer, the term of this patent is extended or adjusted under 35 U.S.C. 154(b) by 235 days.

(21) Appl. No.: 16/514,801

(22) Filed: Jul. 17, 2019

(65) Prior Publication Data

US 2020/0023298 A1 Jan. 23, 2020

Related U.S. Application Data

(60) Provisional application No. 62/700,066, filed on Jul. 18, 2018.

(51) Int. Cl.
| | |
|---|---|
| *B01D 46/00* | (2006.01) |
| *H05K 9/00* | (2006.01) |
| *B01D 39/16* | (2006.01) |
| *B01D 39/20* | (2006.01) |

(52) U.S. Cl.
CPC ..... *B01D 39/1623* (2013.01); *B01D 39/2041* (2013.01); *H05K 9/0041* (2013.01); *B01D 46/0032* (2013.01); *B01D 2239/0241* (2013.01)

(58) Field of Classification Search
CPC .............. B01D 39/083; B01D 39/1623; B01D 39/2041; B01D 46/0032; B01D 46/4209; B01D 2239/0241; B01D 2279/45; B01D 2275/10; H05K 9/0041
See application file for complete search history.

(56) References Cited

U.S. PATENT DOCUMENTS

| | | | | |
|---|---|---|---|---|
| 2,798,614 A | * | 7/1957 | Alexander | B01D 27/06 210/487 |
| 3,763,633 A | * | 10/1973 | Soltis | B03C 3/155 96/58 |
| 5,989,320 A | * | 11/1999 | Rutkowski | B01D 46/0032 96/55 |
| 6,171,357 B1 | | 1/2001 | Guttman | |
| 7,129,422 B2 | | 10/2006 | Arnold | |
| 7,488,901 B2 | | 2/2009 | Arnold | |
| 8,535,404 B2 | | 9/2013 | Crabtree et al. | |
| 8,668,755 B2 | | 3/2014 | Crabtree et al. | |

(Continued)

OTHER PUBLICATIONS

Tech-Etch, "EMI/RFI Shielding Solutions", Catalog available prior to Jul. 17, 2019, 52 Pages.

(Continued)

*Primary Examiner* — Jonathan Miller
*Assistant Examiner* — Gabriel E Gitman
(74) *Attorney, Agent, or Firm* — Vedder Price P.C.

(57) ABSTRACT

A frameless EMC air filter for a conductive enclosure includes a body comprising a conductive layer disposed between two filtering layers, the air filtering layers forming a periphery of the body. The frameless EMC air filter further includes one or more bare edge portions that extend outwardly past the periphery of the body. Each bare edge portion is formed by an extension of the conductive layer capable of providing direct electrical contact with the conductive enclosure.

16 Claims, 4 Drawing Sheets

(56) References Cited

U.S. PATENT DOCUMENTS

2003/0192715 A1* 10/2003 Lambert .............. H05K 9/0041
174/355
2005/0132885 A1 6/2005 Zarganis et al.

OTHER PUBLICATIONS

Air Clean, "Custom Telecom Air Filters/HVAC Air Filters Manufacturer", webpage: https://airclean.com/telecom-air-filters/, available prior to Jul. 17, 2019, 2 Pages.

Universal Air Filter, "Dual EMI Air Filters", webpage:https://www.uaf.com/products/dual-emi-air-filters/, available prior to Jul. 17, 2019, 3 Pages.

Deltam, "100% Recyclable Telecom Filters", webpage:http://pur-airfilters com/products-main/telecom/, available prior to Jul. 17, 2019,2 Pages.

EMC, "Dust Filter Ventilation Panels", webpage: https://hollandshielding.com/EMC-dust-filter-ventilation-panels, available prior to Jul. 17, 2019, 5 Pages.

Learn EMC, "Practical EM Shielding", webpage: https://learnemc.com/practical-em-shielding, available prior to Jul. 17, 2019, 9 Pages.

Electronic Design, "Meet EMI Standards For Electronic Systems", webpage: https://www.electronicdesign.com/technologies/boards/article/21767353/meet-emi-standards-for-electroni . . . , Jun. 7, 1998, 7 Pages.

In Compliance, "The Basic Principles of Shielding", webpage: https://incompliancemag.com/article/the-basic-principles-of-shielding/, Mar. 1, 2014, 8 Pages.

Universal Air Filter, "Power Generation", webpage:https://www.uaf.com, available prior to Jul. 17, 2019, 3 Pages.

Wikipedia, "Continuity Test", Continuity test—Wikipedia.html, available prior to Jul. 17, 2019, (this page was last editited Jun. 18, 2018)1 Page.

Wikipedia, "Network Equipment-Building System", Wikipedia.html, available prior to Jul. 17, 2019, (this page was last editited Apr. 13, 2018), 1 Page.

* cited by examiner

FRAMELESS EMC AIR FILTER

CROSS-REFERENCE TO RELATED APPLICATIONS

This application claims priority to U.S. Provisional Patent Application No. 62/700,066, filed Jul. 18, 2018, the contents of which is hereby incorporated by reference in their entirety.

BACKGROUND

The present invention relates to air filters for electronic equipment and more specifically to frameless electromagnetic compatibility (EMC) air filters.

Various types electronic equipment require effective air flow for removing equipment exhaust heat so as to maintain proper and optimum operability. To prevent dust and other airborne contaminants from entering electronic devices and impeding heat removal or damaging components, air filters may be used to filter the air flow. The NEBS (Network Equipment-Building System) GR-63 Core standard, for example, is intended among other things to help avoid telecommunications equipment damage and malfunction caused by such things as temperature and humidity, vibrations, and airborne contaminants. In particular, the GR-63 Core standard requires that forced air-cooled telecommunications equipment shall be fitted with suitable air filters having minimum dust arrestance/efficiency ratings to remove particulate matter that has not been filtered out by the return air systems of a building.

In addition, many electronic devices have required EMC levels to ensure safe and reliable operation in electromagnetic (EM) environments. For example, the NEBS GR-1089 testing/certification requirements are intended to ensure that telecommunications equipment meets the EMC and electrical safety criteria necessary to perform safely and reliably, including avoiding equipment damage and malfunction because of lightning, 60-Hz commercial power fault conditions, Electrostatic Discharge (ESD), Electrical Fast Transient (EFT), and Electromagnetic Interference (EMI), and ensuring proper operation in the presence of a DC potential difference or in a steady-state induced voltage environment. The GR-1089 requirements also consider safe voltage levels for intentionally applied sources, electrochemical corrosion effects, grounding, and DC powering.

Many existing air filters include a metal frame that surrounds an air filter element for EMI shielding. However, when such an air filter including the frame is received within an opening, by virtue of the frame's intrusive construction into the opening, the frame impedes airflow through the opening and reduces the surface area of the air filter available for filtration. For example, many types of equipment enclosures now require filters that are only one Rack Unit (less than two inches) in width. A typical metal frame would encroach about one inch of the width of such an air filter that is one Rack Unit in width, thereby reducing the air flow surface area of the air filter in half. Thus, it may be necessary to ensure that air filters for electronic equipment are capable of providing desired levels of airflow, filtration efficiency and EMC compatibility.

SUMMARY

In some embodiments, the disclosure provides a frameless EMC air filter for a conductive enclosure. The frameless EMC air filter includes a body comprising a conductive layer disposed between two filtering layers, the air filtering layers forming a periphery of the body. The frameless EMC air filter further includes one or more bare edge portions that extend outwardly past the periphery of the body. Each bare edge portion is formed by an extension of the conductive layer capable of providing direct electrical contact with the conductive enclosure.

In some embodiments, the disclosure provides a frameless EMC air filter having a body that includes an air filter media and a wire mesh. The frameless EMC air filter further has one or more bare edge portions that are formed from a portion of the wire mesh adjacent to and extending outwardly past the periphery of the air filter media to define one or more conductive contact surfaces of the frameless EMC air filter.

Other aspects of the disclosure will become apparent by consideration of the detailed description and accompanying drawings.

DETAILED DESCRIPTION

Figure 1:
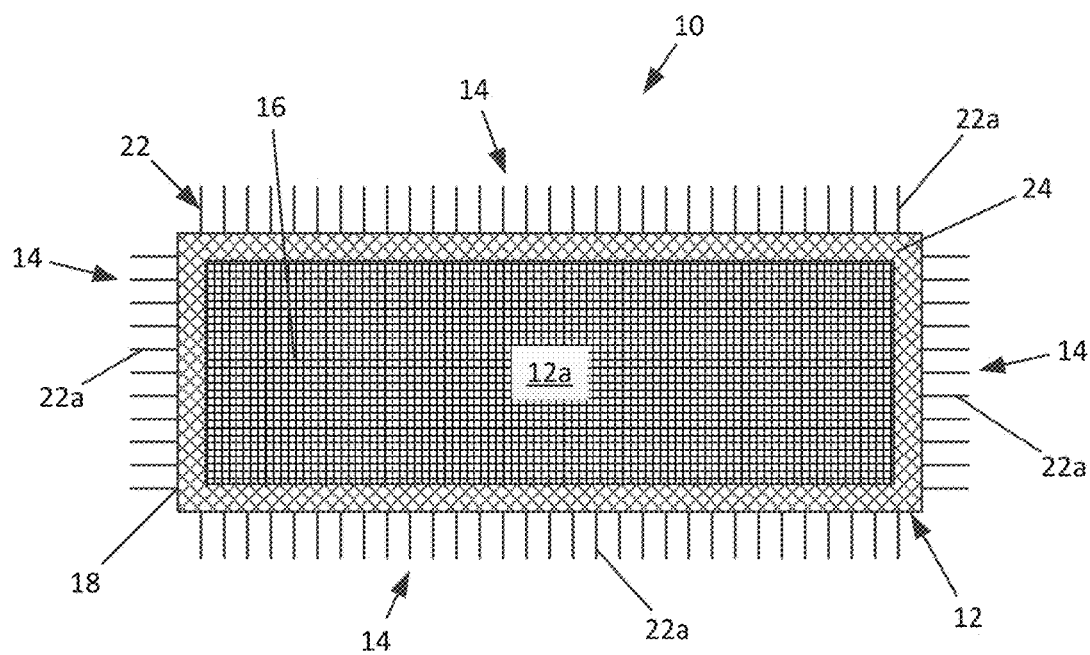
FIG. 1 is a top view of a frameless EMC air filter in accordance with an embodiment of the present disclosure.
Figure 2:
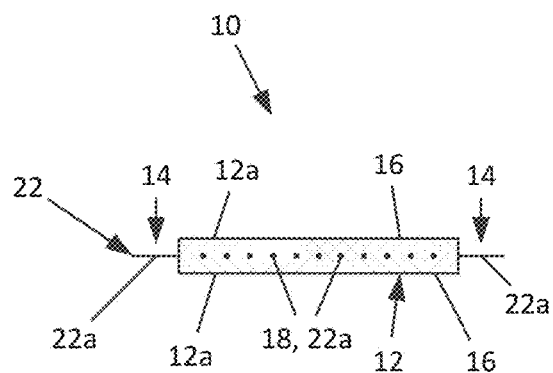
FIG. 2 is a side view of the frameless EMC air filter of FIG. 1.

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways.

Referring now to the figures, FIGS. 1-3 and 5 illustrate an embodiment of an air filter 10 having a body 12, which may be of a generally flat rectangular shape, square shape, circular shape, oblong shape, or of some other shape suitable for covering an opening according to the intended application of the air filter, and bare edge portions 14 extending from the sides of the body 12.

The body 12 may comprise at least one filtering layer 16 and at least one conductive layer 18. In the illustrated embodiment, the air filter body 12 comprises a pair of generally parallel filtering layers 16 that define a pair of oppositely facing outer surfaces 12a of the body 12 and a periphery of the body 12, and a conductive layer 18 that is located between the filtering layers 16. Each of the filtering layers 16 of the body 12 is formed from an air filter media. The conductive layer 18 of the body 12 and the bare edge portions 14 may be formed from a wire mesh 22. In particular, the bare edge portions 14 of the air filter 10 comprise end segments 22a of the wire mesh 22 (as described below) that are adjacent to and extend outwardly past the periphery of the body 12.

The air filter media of the filtering layers 16 forms the filtering component for the air filter 10. The air filter media may be of any suitable shape and material depending on the intended application for the air filter, including, for example, compatibility with the NEB S GR-163 Core requirements. In some embodiments, different materials may be selected for different air filter media to capture different types of particulate matter or remove fumes. For example, the air filter media can be made of a thermoplastic material, such as polypropylene, polyester, or polyvinylchloride (PVC), which can be plastic welded (as described below).

More specifically, the air filter media may be made of woven, non-conductive polypropylene fibers, including woven, non-conductive polypropylene fibers containing an inherent electrostatic charge that won't wash out or diminish over time. In particular, 12 mil or 20 mil woven polypropylene air filter media can have excellent strength, is very resistant to abrasion, most acids, alkalies, bleaches, solvents, aging, and indirect sunlight, and is nonporous and mildew resistant. In some embodiments, the air filter media can be made, for example, of PermaCool®, which is a self-supporting polypropylene air filter media available from Permatron Corp. (Elk Grove Village, Ill.). The PermaCool® media has a dense, 3 layer, waffle weave configuration providing enhanced filtration ability and creating a rigid and durable electrostatic air filter material than can be cut-to-fit a particular application or piece of equipment.

In other embodiments, the air filter media forming the filtering layers 16 can be made of nonwoven polyester fibers that are randomly dispersed in all directions through an air laid web to form a uniform media of high strength and durability such that a high volume of contaminants can be trapped within the complete depth of fiber. The nonwoven polyester air filter media may have a thickness, for example, in in the range of about 0.25 in. to about 2.0 in. A suitable nonwoven polyester air filter media may be the PermaFlo® rigid polyester media available from Permatron Corp. (Elk Grove Village, Ill.), which is self-supporting and needs no frame.

The wire mesh 22 may be selected to provide required levels of EMC compatibility for the air filter 10, for example, EMC compatibility with the NEBS GR-1089 testing/certification requirements. The wire mesh 22 may also be selected to allow for effective bonding with the air filter media (as described below) or to minimize any interference with the airflow through the air filter 10. The wire mesh 22 may also be selected to provide (in combination with the air filter media of the filtering layers 16) a desired rigidity for the body 12 and a desired flexibility for the bare edge portions 14 of the air filter. For example, the wire mesh 22 may be a welded or woven wire mesh made of uncoated steel, aluminum or other conductive metal wire that provides electrical continuity between any two points on the wire mesh. In some embodiments, the wire mesh 22 may have a wire diameter in the range of about 0.007 in. to about 0.011 in. for steel wire and a mesh count in the range of about 8×8 to about 24×24 per sq. in. In other embodiments, the wire mesh 22 may have a wire diameter in the range of about 0.008 in. to about 0.0225 in. for aluminum wire and a mesh count in the range of about 8×8 to about 24×24 per sq. in. Thus, it is possible to achieve different levels of airflow, filtration efficiency and EMC compatibility for the air filter 10 using a layered configuration for the body 12, including at least one filtering layer 16 and at least one conductive layer 18, by using different types of air filter media for the filtering layers 16 and different types of wire mesh 22 in the conductive layer 18.

Referring again to FIGS. 1-3 and 5, the end segments 22a of the wire mesh 22 in the bare edge portions 14 may comprise the end segments of those wires in the wire mesh 22 that extend across the body 12 and outwardly past the periphery of the body 12. When the air filter 10 is mounted to an opening (not shown), for example a fan opening, formed in a conductive enclosure of an electronic device, the bare edge portions 14 form conductive contact surfaces for the wire mesh 22 and are in direct electrical contact with the enclosure and provide a current path across the opening. As a result, the wire mesh 22 can be connected to electrical ground and can provide a current path across the opening of the equipment enclosure so as to provide effective EMC compatibility. The bare edge portions 14 of the air filter thus eliminate the need for a conductive frame surrounding the air filter 10. Because the air filter is frameless, the area of the air filter exposed to airflow is maximized and available for filtration.

The bare edge portions 14 of the air filter 10 may extend outwardly past the periphery of the body 12 on at least two sides of the body 12, for example on at least two opposing or diametrically opposite sides of the body 12. In the illustrated embodiment, the bare edge portions 14 of the air filter extend outwardly past the periphery of the body 12 on each side of the rectangular shaped body 12. When the air filter 10 is mounted to an opening (not shown) formed in a conductive enclosure of an electronic device, this arrangement ensures maximum conductivity between the enclosure and the wire mesh 22 (or conductive layer 18) and minimum impedance to the flow of conduction currents on the surface of the enclosure near the opening covered by the air filter 10.

The bare edge portions 14 of the air filter are dimensioned and shaped to ensure effective electrical contact with the conductive enclosure of an electronic device when the air filter 10 is mounted to an opening (not shown) formed in the enclosure. For example, the bare edge portions 14 may be substantially planar and oriented parallel to the outer surfaces 12a of the body 12. In particular, with reference to the embodiment illustrated in FIG. 1, the end segments 22a of the wires in the wire mesh 22, which form the bare edge portions 14, may extend for a predetermined distance, for example about 0.25 in., past the periphery of the body 12, and be coplanar with the conductive layer 18.

Figure 4:
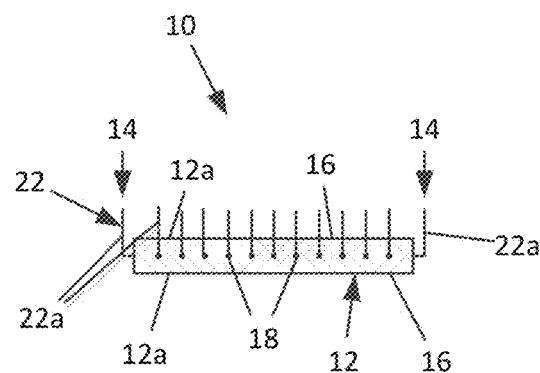
FIG. 4 is a side view of a frameless EMC air filter in accordance with another embodiment of the present disclosure.
Figure 3:
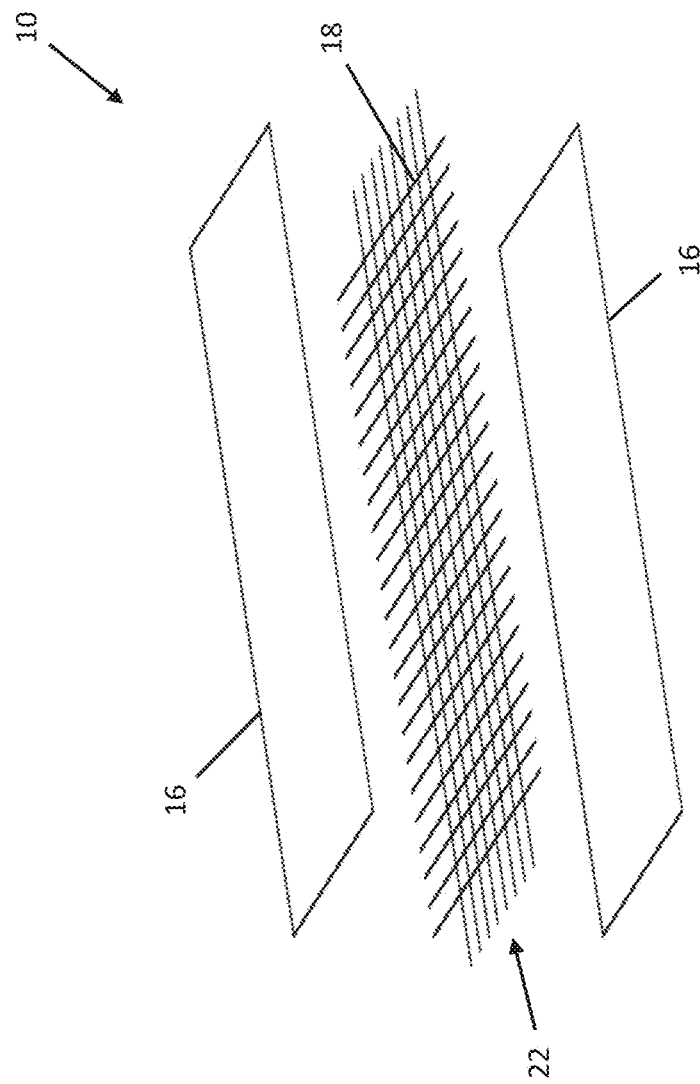
FIG. 3 is an exploded view of the frameless EMC air filter of FIG. 1.
Figure 5:
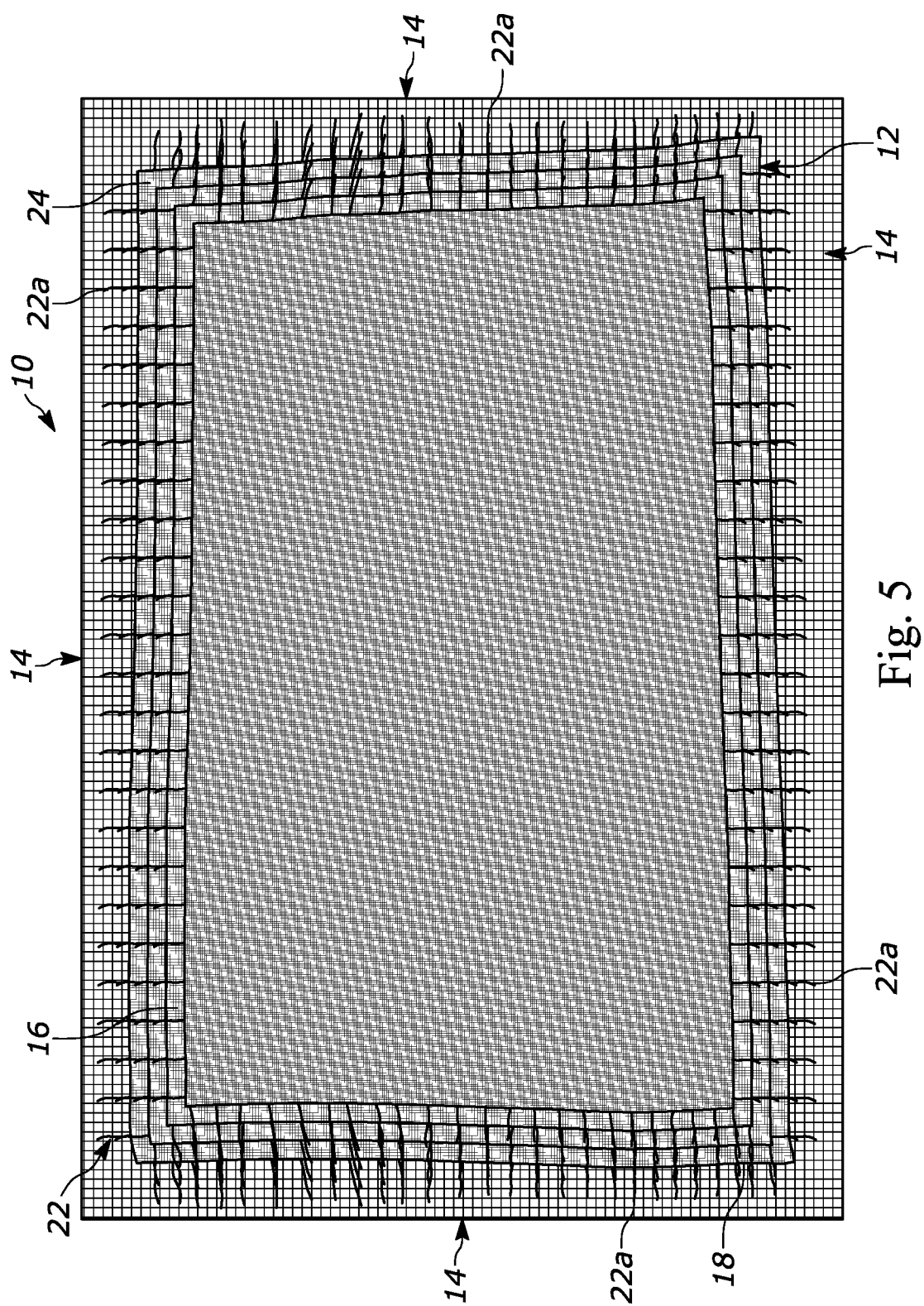
FIG. 5 is a photograph of a frameless EMC air filter in accordance with another embodiment of the present disclosure.

Alternatively, the bare edge portions 14 may be oriented at an angle relative to the conductive layer 18 of the body 12. In the embodiment illustrated in FIG. 4, for example, the wires of the wire mesh 22 may form an angle at the periphery of the body 12 such that the end segments 22a of those wires that form a pair of oppositely facing bare edge portions 14 extend into a plane that is non-parallel to the conductive layer 18 of the body 12. In some embodiments, the material for the wire mesh 22 is selected such that the end segments 22a of the wires forming the bare edge portions 14 are sufficiently flexible to allow a user to manually adjust their shape and orientation or to deform when inserted into an opening smaller than the undeformed insertion profile of air filter 10 and be self-gasketing.

The conductive layer 18 may be secured to the filtering layers 16 by welding, adhesive, fastener, or the like. The conductive layer 18 may be secured to the filtering layers 16 proximate the periphery of the body 12 or other areas of the body 12 suitable for maintaining structural integrity, airflow, filtration efficiency and EMC compatibility of the air filter 10. With reference to the embodiment illustrated in FIGS. 1 and 3, one or more seams 24 may be formed along the periphery of the body 12 to join together the conductive layer 18 and the filtering layers 16. For example, when the air filter media forming the filtering layers 16 is a thermoplastic material, the filtering layers 16 may be welded with the conductive layer 18 sandwiched between them using suitable plastic welding techniques applied locally to the seam 24. In some embodiments, the plastic welding techniques may include thermal welding, ultrasonic welding, vibration welding, thermal welding, induction welding, or solvent welding. As the thermoplastic material of the air filter media forming the filtering layers 16 and/or a plastic filler begins to melt upon welding, it flows over the wires of the wire mesh 22. Then, as the thermoplastic material is cooled, the weld solidifies around the wires of the wire mesh 22 so as to bond the conductive layer 18 and the filtering layers 16 to each other without disturbing the continuity and EMC compatibility properties of the wire mesh 22. Alternatively, the conductive layer 18 and the filtering layer(s) 16 may be joined at the seam by sewing, staples, adhesives, or any other suitable means that does disturb the continuity and EMC compatibility properties of the wire mesh 22.

Figure 6:
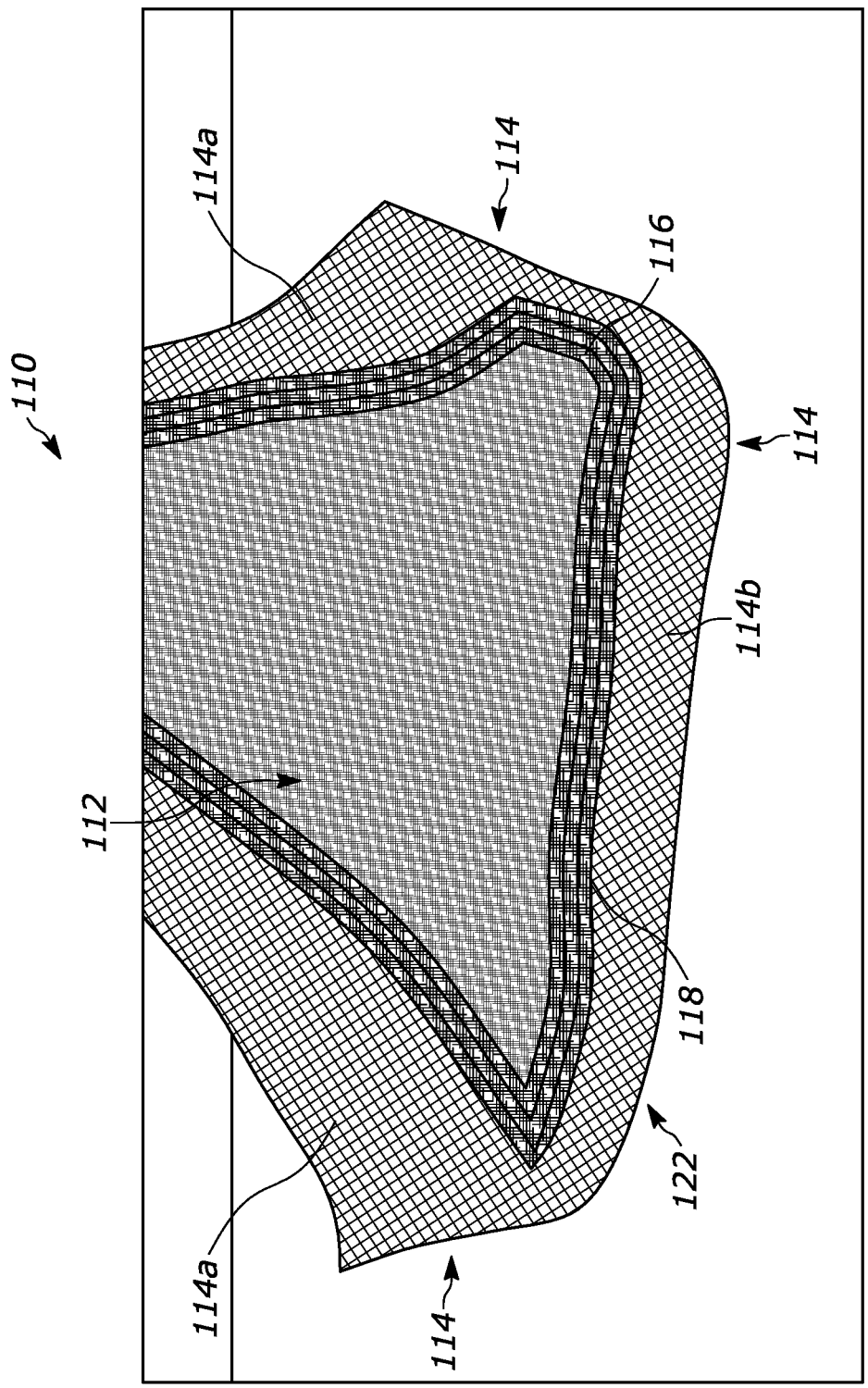
FIG. 6 is a photograph of a frameless EMC air filter in accordance with another embodiment of the present disclosure.

In another embodiment illustrated in FIG. 6, an air filter 110 includes a body 112 and bare edge portions 114 extending from the sides of the body 112. The air filter body 112 comprises a filtering layer 116 formed from an air filter media that is attached to a conductive layer 118 formed from a wire mesh 122. For example, the air filter media may be a rectangular shaped pad made of nonwoven polyester fibers that is compatible with the NEBS GR-163 Core requirements. The wire mesh 122 may be a welded wire mesh made of uncoated steel, aluminum or other conductive metal wire capable of providing EMC compatibility with the NEBS GR-1089 testing/certification requirements. The filtering layer 116 may attached to the conductive layer 118 by welding, adhesive, fastener, or the like, including by plastic welding so as to melt the air filter media through the wire mesh 122 and form a bond with the wire mesh.

The bare edge portions 114 of the air filter 110 comprise end segments 122a of the wire mesh 122 that are adjacent to and extend outwardly past the periphery of the body 112. In the illustrated embodiment, the bare edge portions 114 include a first pair of oppositely facing longitudinal edge portions 114a and a second pair of oppositely facing lateral edge portions 114b. The longitudinal edge portions 114a form an angle at the periphery of the body 112 (which is formed by the sides of the air filter media 120) and extend out of the plane of the conductive layer 118 and into a plane that is non-parallel to the conductive layer 118. The lateral edge portions 114b extend substantially into the same plane as the conductive layer 118. The bare edge portions 114 of the air filter thus eliminate the need for a conductive frame surrounding the air filter 110. Consequently, the air filter 10 can be frameless, thereby maximizing the area of the air filter exposed to airflow and available for filtration.

In other embodiments, the conductive layer 18 of the body 12 may be formed from a plurality of conductive metal wires. For example, the conductive layer 18 may include a plurality of individual conductive metal wires that are inserted or fed through a corrugated air filter media, such as PermaCool®, of the filtering layer 16. The individual wires of the conductive layer 18 may be touching or non-touching once inserted or fed through the filtering layer 16. The individual wires of the conductive layer 18 may also form a grid pattern or they may extend generally parallel to each other once inserted or fed through the filtering layer 16. Further, the bare edge portions 14 of the air filter 10 may comprise end segments 22a of the individual wires that are adjacent to and extend outwardly past the periphery of the body 12.

What is claimed is:

1. A frameless air filter for a conductive enclosure, the frameless air filter comprising:
a body including two air filtering layers and a conductive layer disposed between the air filtering layers, the air filtering layers forming a periphery of the body; and
one or more bare edge portions that extend outwardly past the periphery of the body, each bare edge portion being formed by an extension of the conductive layer capable of providing direct electrical contact with the conductive enclosure.

2. The frameless air filter of claim 1, wherein the conductive layer and the one or more bare edge portions have a unitary construction.

3. The frameless air filter of claim 1, wherein the conductive layer and the one or more bare edge portions are formed by a wire mesh.

4. The frameless air filter of claim 3, wherein the conductive layer and the air filter layers are fastened together at a seam proximate the periphery of the body.

5. The frameless air filter of claim 3, wherein the air filtering layers are made of a thermoplastic material and the conductive layer is fastened together with the air filtering layers at a plastic welded seam.

6. The frameless air filter of claim 1, wherein the body has at least two sides and a first one and a second one of the bare edge portions are on opposite sides of the body.

7. The frameless air filter of claim 1, wherein the body has four sides and the bare edge portions extend outwardly past each side of the body.

8. The frameless air filter of claim 3, wherein the one or more bare edge portions are formed by end segments of the wire mesh that are oriented non-parallel to the conductive layer.

9. The frameless air filter of claim 1, wherein the one or more bare edge portions are manually adjustable to different angular orientations relative to the conductive layer.

10. A frameless air filter comprising:
a body including an air filter media and a wire mesh; and
one or more bare edge portions each formed from a portion of the wire mesh adjacent to and extending outwardly past the periphery of the air filter media to define one or more conductive contact surfaces of the frameless air filter.

11. The frameless air filter of claim 10, wherein the wire mesh is attached to an outer surface of the air filter media.

12. The frameless air filter of claim 10, wherein the air filter media is made of a thermoplastic material and the wire mesh is attached to the air filter media at a plastic welded seam.

13. The frameless air filter of claim 10, wherein the body has at least two sides and a first one and a second one of the bare edge portions are on opposite sides of the body.

14. The frameless air filter of claim 10, wherein the body has four sides and the bare edge portions extend outwardly past each side of the body.

15. The frameless air filter of claim 14, wherein a first one and a second one of the bare edge portions are oriented parallel to the conductive layer and a third one and a fourth one of the bare edge portions are oriented non-parallel to the conductive layer.

16. The frameless air filter of claim 10, wherein the one or more bare edge portions are each manually adjustable to different angular orientations relative to the body.

* * * * *